United States Patent
Akram et al.

(10) Patent No.: US 6,414,506 B2
(45) Date of Patent: *Jul. 2, 2002

(54) INTERCONNECT FOR TESTING SEMICONDUCTOR DICE HAVING RAISED BOND PADS

(75) Inventors: Salman Akram, Boise; Warren M. Farnworth, Nampa; Alan G. Wood, Boise, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/213,573

(22) Filed: Dec. 17, 1998

Related U.S. Application Data (60) Continuation of application No. 08/688,169, filed on Sep. 23, 1996, now abandoned, which is a division of application No. 08/369,067, filed on Jan. 5, 1995, now Pat. No. 5,592,736, which is a continuation-in-part of application No. 08/335,267, filed on Nov. 7, 1994, now Pat. No. 5,483,741, which is a continuation-in-part of application No. 08/206,747, filed on Mar. 4, 1994, now Pat. No. 5,523,697, which is a division of application No. 08/116,394, filed on Sep. 3, 1993, now Pat. No. 5,326,428.

(51) Int. Cl.⁷ .............................................. G01R 31/26
(52) U.S. Cl. ........................................ 324/765; 324/757
(58) Field of Search ................................ 324/754–758, 324/761, 765

(56) References Cited

U.S. PATENT DOCUMENTS

| | | | |
|---|---|---|---|
| 4,329,642 A | 5/1982 | Luthi et al. | 324/158 F |
| 4,585,991 A | 4/1986 | Reid et al. | 439/66 |
| 4,899,107 A | 2/1990 | Corbett et al. | 324/158 F |
| 4,937,653 A | 6/1990 | Blonder et al. | 357/68 |
| 4,943,343 A | 7/1990 | Bardai et al. | 156/643 |
| 4,952,272 A | 8/1990 | Okino et al. | 156/630 |
| 5,073,117 A | 12/1991 | Malhi | 439/71 |
| 5,137,461 A | 8/1992 | Bindra et al. | 439/74 |
| 5,172,050 A | 12/1992 | Swapp | 324/158 P |
| 5,177,438 A | 1/1993 | Littlebury et al. | 324/158 P |

(List continued on next page.)

FOREIGN PATENT DOCUMENTS

| | | | |
|---|---|---|---|
| JP | Hei 3-69131 | 3/1991 | |
| JP | Hei3-69131 | 3/1991 | H01L/21/66 |

Primary Examiner—Michael Sherry
Assistant Examiner—Russell M. Kobert
(74) Attorney, Agent, or Firm—Stephen A. Gratton (57) ABSTRACT

A method for testing unpackaged semiconductor dice having raised contact locations (e.g., bumped bond pads) and a method for forming an interconnect suitable for testing this type of dice are provided. The interconnect includes a substrate having contact members comprising an array of sharpened elongated projections. The sharpened projections are formed by etching (or by growing and removing an oxide) through exposed areas of a mask. A conductive layer is formed on the sharpened projections and is in electrical communication with conductive traces formed on the substrate. The conductive layer can be formed as a layer of metal, as a stack of metals including a barrier metal, as a silicide, or as a layer of polysilicon. For testing an unpackaged die, the interconnect and die are placed in a temporary carrier and biased together. The sharpened projections are adapted to penetrate the contact location on the die to a limited penetration depth to establish an ohmic connection while minimizing damage to the contact location.

12 Claims, 6 Drawing Sheets

U.S. PATENT DOCUMENTS

| | | | |
|---|---|---|---|
| 5,177,439 A | 1/1993 | Liu et al. ................ 324/158 P |
| 5,196,726 A | 3/1993 | Nishiguchi et al. |
| 5,206,585 A | 4/1993 | Chang et al. |
| 5,207,585 A | 5/1993 | Byrnes et al. ............ 324/158 P |
| 5,302,891 A | 4/1994 | Wood et al. .............. 324/158 F |
| 5,323,035 A | 6/1994 | Ledy .......................... 257/248 |
| 5,326,428 A | 7/1994 | Farnworth et al. .......... 156/654 |
| 5,329,423 A | 7/1994 | Scholz ....................... 361/760 |
| 5,341,564 A | 8/1994 | Akhavain et al. |
| 5,367,253 A | 11/1994 | Wood et al. .............. 324/158.1 |
| 5,408,190 A | 4/1995 | Wood et al. ................ 324/765 |
| 5,419,807 A | 5/1995 | Akram et al. ............ 156/647.1 |
| 5,420,520 A | 5/1995 | Anschel et al. ............. 324/754 |
| 5,478,779 A | 12/1995 | Akram ....................... 437/189 |
| 5,481,205 A | 1/1996 | Frye et al. ................. 324/757 |
| 5,483,741 A | 1/1996 | Akram et al. ................. 29/846 |
| 5,495,179 A | 2/1996 | Wood et al. ................. 324/755 |
| 5,500,605 A | 3/1996 | Chang ........................ 324/758 |
| 5,519,332 A | 5/1996 | Wood et al. ................. 324/755 |
| 5,523,696 A | 6/1996 | Charlton et al. ............ 324/758 |
| 5,523,697 A | 6/1996 | Farnworth et al. .......... 324/758 |
| 5,541,525 A | 7/1996 | Wood et al. ................. 324/755 |
| 5,592,736 A | 1/1997 | Akram et al. ................. 29/842 |
| 5,625,298 A | 4/1997 | Hirano et al. ............... 324/754 |
| 5,629,837 A | 5/1997 | Barabi et al. |
| 5,686,317 A | 11/1997 | Akram et al. .................. 437/8 |
| 5,691,041 A | 11/1997 | Frankeny et al. |
| 5,691,649 A | 11/1997 | Farnworth et al. .......... 324/755 |
| 5,781,022 A | 7/1998 | Wood et al. |
| 5,815,000 A | 9/1998 | Farnworth et al. .......... 324/755 |
| 5,844,418 A | 12/1998 | Wood et al. ................. 324/755 |

INTERCONNECT FOR TESTING SEMICONDUCTOR DICE HAVING RAISED BOND PADS

CROSS REFERENCE TO RELATED APPLICATIONS

This application is a continuation of application Ser. No. 08/688,169, filed on Sep. 23, 1996, now abandoned, which is a division of application Ser. No. 08/369,067, filed Jan. 5, 1995, U.S. Pat. No. 5,592,736, which is a continuation-in-part of application Ser. No. 08/335,267, filed Nov. 7, 1994, U.S. Pat. No. 5,483,741, which is a continuation-in-part of application Ser. No. 08/206,747, filed Mar. 4, 1994, U.S. Pat. No. 5,523,697, which is a division of application Ser. No. 08/116,394, filed Sep. 3, 1993, U.S. Pat. No. 5,326,428.

FIELD OF THE INVENTION

This invention relates to semiconductor manufacture and to methods for testing the operability of unpackaged semiconductor dice having raised or bumped bond pads. In addition, this invention relates to methods for fabricating an interconnect suitable for testing the operability of integrated circuitry on an unpackaged semiconductor die formed with raised or bumped bond pads.

BACKGROUND OF THE INVENTION

Because of a trend towards multi-chip modules, semiconductor manufacturers are required to supply unpackaged dice that have been tested and certified as known good die (KGD). Known good die is a collective term that denotes unpackaged die having the same reliability as the equivalent packaged die.

The need for known good die has led to the development of test apparatus in the form of temporary carriers suitable for testing discrete, unpackaged semiconductor dice. As an example, test apparatus for conducting burn-in tests for discrete die are disclosed in U.S. Pat. No. 4,899,107 to Corbett et al. and U.S. Pat. No. 5,302,891 to Wood et al., which are assigned to Micron Technology, Inc. Other test apparatus for discrete die are disclosed in U.S. Pat. No. 5,123,850 to Elder et al., and U.S. Pat. No. 5,073,117 to Malhi et al., which are assigned to Texas Instruments.

With this type of test apparatus, a non-permanent electrical connection must be made between contact locations on the die, such as bond pads, and external test circuitry associated with the test apparatus. The bond pads provide a connection point for testing the integrated circuitry formed on the die.

In making this temporary electrical connection, it is desirable to effect a connection that causes as little damage as possible to the bond pad. If the temporary connection to a bond pad damages the pad, the entire die may be rendered as unusable. This is difficult to accomplish because the connection must also produce a low resistance or ohmic contact with the bond pad. A bond pad typically includes a metal oxide layer that must be penetrated to make an ohmic contact.

Some prior art contact structures, such as probe cards, scrape the bond pads which wipes away the oxide layer and causes excessive damage to the bond pads. Other interconnect structures such as probe tips may pierce both the oxide layer and the metal bond pad and leave a deep gouge. Still other interconnect structures, such as microbumps, may not even pierce the oxide layer preventing the formation of an ohmic contact.

Another important consideration in testing of known good die is the effect of thermal expansion during the test procedure. As an example, during burn-in testing, a die is heated to an elevated temperature and maintained at temperature for a prolonged period. This causes thermal expansion of the die and temporary interconnect. If the die and the temporary interconnect expand by a different amount, stress may develop at the connection point and adversely effect the electrical connection. This may also lead to excessive damage of bond pads.

One type of semiconductor dice having a raised topology is referred to as a "bumped" die. A "bumped" semiconductor die includes bond pads formed with a bump of solderable material such as a lead-tin alloy. Bumped dice are often used for flip chip bonding wherein the die is mounted face down on a substrate, such as a printed circuit board, and then attached to the substrate by welding or soldering. Typically the bumps are formed as balls of material that are circular in a cross sectional plane parallel to the face of the die. The bumps typically have a diameter of from 50 μm to 100 μm. The sides of the bump typically bow or curve outwardly from a flat top surface. The flat top surface forms the actual region of contact with a mating electrode on the printed circuit board or other substrate.

In the past, following testing of a bumped die, it has been necessary to reflow the bumps, which are typically damaged by the test procedure. This is an additional process step which adds to the expense and complexity of the testing process. Furthermore, it requires heating the tested die which can adversely affect the integrated circuitry formed on the die.

OBJECTS OF THE INVENTION

In view of the need in the art for improved methods for testing unpackaged, bumped, semiconductor dice, it is an object of the present invention to provide an improved method of testing unpackaged semiconductor dice having raised or bumped bond pads.

It is a further object of the present invention to provide an improved method for forming a temporary interconnect adapted to test semiconductor die having raised or bumped bond pads.

It is a further object of the present invention to provide an improved method for fabricating temporary interconnects for bumped semiconductor dice that uses semiconductor manufacturing techniques and that provides an improved contact structure.

Other objects, advantages and capabilities of the present invention will become more apparent as the description proceeds.

SUMMARY OF THE INVENTION

In accordance with the present invention, an improved method of testing, and an improved method for fabricating a temporary interconnect for testing unpackaged semiconductor dice having raised contact locations (e.g., bumped bond pads) are provided. The improved method of testing includes a temporary interconnect adapted to establish an electrical connection with raised contact locations on the die without damage to the contact locations. The interconnect includes a substrate (e.g., silicon) having contact members formed in a pattern that matches the size and spacing of the contact locations on the die. The contact members on the interconnect include one or more sharpened projections. The sharpened projections are adapted to penetrate the raised contact locations on the die and to pierce any residual insulating material to establish an ohmic connection.

The sharpened projections are formed integrally with the substrate using an etching process or using an oxidation growth process. The sharpened projections are formed either on a surface of the substrate, or in a recess in the substrate which is sized to retain the raised contact locations on the die. In addition, the sharpened projections are formed with a size and shape which permits penetration into the contact locations but with a self-limiting penetration depth. In an illustrative embodiment, the sharpened projections are formed as an array of parallel elongated blades. Depending on the method of formation, the elongated blades can be formed in a variety of cross sectional configurations (e.g., triangular, rounded profile, flat tops). In addition, the elongated blades can be formed in a spaced array or with no spaces therebetween.

The sharpened projections are formed on an insulating layer of the interconnect substrate and are covered with a conductive layer. The conductive layer can be formed as a single layer of a highly conductive metal such as aluminum or iridium, or a conductive material such as polysilicon. Conductive traces or runners are formed in electrical contact with the conductive layer to establish an electrical pathway to and from the contact members of the interconnect.

The conductive layer for the contact members can also be formed as a stack comprising two different layers of material. An outer layer of the stack is preferably a metal such as platinum, which is chemically inert and provides a barrier layer that will not react with the raised material (e.g., bump) at the contact location on the die. The inner layer of the stack can be a metal such as aluminum or titanium which can be easily bonded to conductive traces. The inner layer and conductive traces can also be formed of a same material.

The conductive layer can also be formed as a metal silicide. A metal silicide can be formed by depositing a silicon containing layer and a metal layer on the sharpened projections and reacting these layers to form a metal silicide. The unreacted portions of the silicon containing layer and metal layer are then etched selective to the metal silicide using a salicide process.

A method for fabricating a temporary interconnect in accordance with the invention, includes the steps of: forming a substrate; forming an array of contact members on the substrate as one or more elongated sharpened projections adapted to penetrate a raised contact location (e.g., bump) on a die to a limited penetration depth; forming an insulating layer (e.g., $SiO_2$, $Si_3N_4$) over the entire substrate including the sharpened projections; forming a conductive layer over the sharpened projections; and then forming conductive traces on the substrate in electrical communication with the conductive layer. Optionally, the sharpened projections can be mounted within an indentation formed in the substrate that is adapted to retain the raised contact location on the die.

Preferably a large number of interconnects are formed on a single substrate or wafer. This substrate can then be diced (e.g., saw cut) to singulate the interconnects. In use, the temporary interconnect is placed in a temporary carrier (i.e., test apparatus) along with the die, and an electrical path is established between the conductive traces on the interconnect and external test circuitry associated with the test apparatus.

DETAILED DESCRIPTION OF THE PREFERRED EMBODIMENTS

Figure 1:
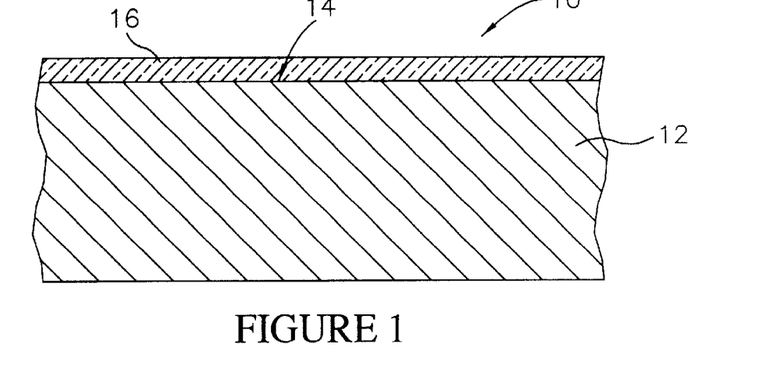
FIG. 1 is a schematic cross sectional view illustrating a substrate and a mask layer during an initial process step for forming an interconnect in accordance with the invention.

Referring now to FIG. 1, a process for forming an interconnect 10 for testing unpackaged semiconductor dice having raised contact locations, such as bumped bond pads, is shown. The interconnect 10 includes a substrate 12 formed of a material having a coefficient of thermal expansion (CTE) that closely matches the CTE of a silicon die. Suitable materials for the substrate include monocrystalline silicon, silicon-on-glass, silicon-on-sapphire, germanium, or ceramic.

The substrate 12 includes a planar outer surface 14 having a mask layer 16 of a material such as silicon nitride ($Si_3N_4$) formed thereon. A typical thickness for the mask layer 16 is about 500 Å to 3000 Å. The mask layer 16 may be formed using a suitable deposition process such as CVD.

Figure 2:
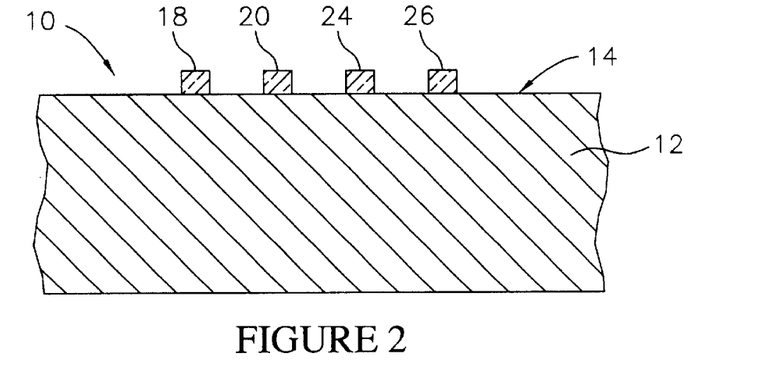
FIG. 2 is a schematic cross sectional view of the substrate taken along section line 2—2 of FIG. 3 showing the mask layer after patterning and etching to form a mask having solid areas and openings.

Next, as shown in FIG. 2, the mask layer 16 is patterned and etched selective to the substrate 12 to form a hard mask that includes masking blocks 18, 20, 24, 26 and openings therebetween. Depending on the materials used for the mask layer 16, this etch step may be performed using a wet or dry etch. As an example, a layer of silicon nitride may be etched with a pattern of openings using hot (e.g., 180° C.) phosphoric acid.

Figure 3:
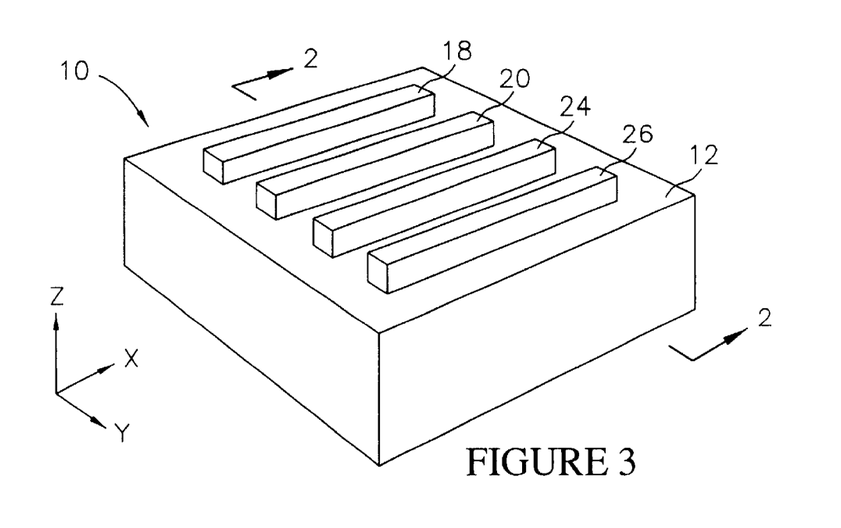
FIG. 3 is a perspective view of FIG. 2.

As shown in the perspective view of FIG. 3, the masking blocks 18, 20, 24, 26 are elongated rectangular blocks. In addition, the masking blocks 18, 20, 24, 26 are formed in a parallel spaced array. The peripheral dimensions of the array are selected to accommodate the dimensions of a raised contact location on a semiconductor die. As an example, the raised contact location can be a bond pad having a metal bump with a diameter of from 1 μm–500 μm. As is apparent however, such a parallel spaced array is merely exemplary and other configurations are possible. Other suitable arrangements for the masking blocks include enclosed rectangles, squares, triangles, T-shapes and X-shapes.

Figure 4:
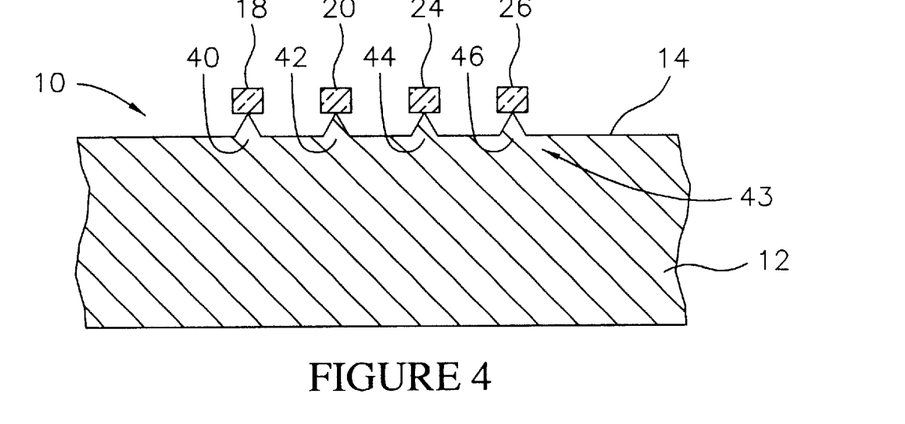
FIG. 4 is a cross sectional view showing formation of the sharpened projections on the substrate using the mask layer and an etch process.

Next, as shown in FIG. 4, elongated sharpened projections 40, 42, 44, 46 are formed on the substrate 12. The sharpened projections 40, 42, 44, 46 can be formed using an etching process (anisotropic or isotropic), using an oxidation process, or using a deposition process.

With etching, a wet or dry isotropic, or anisotropic, etch process is used to form the sharpened projections 40, 42, 44, 46 as the material under the masking blocks 18, 20, 24, 26 is undercut by the etchant reacting with the substrate 12. In other words, the exposed substrate 12 between the masking blocks 18, 20, 24, 26 etches faster than the covered substrate 12 under the blocks 18, 20, 24, 26.

Figure 5A:
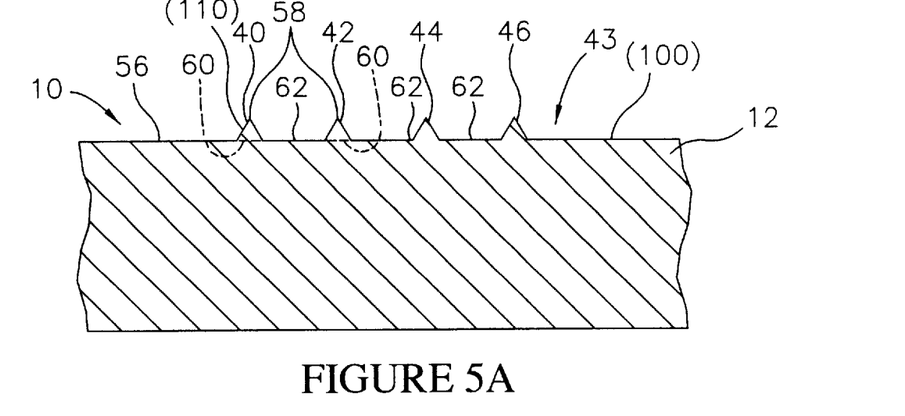
FIG. 5A is a cross sectional view taken along section line 5A—5A of FIG. 6 showing the sharpened projections formed on the substrate with a triangular cross section using an anisotropic etch process.

Following the etching process the masking blocks 18, 20, 24, 26 are stripped using a wet etchant such as $H_3PO_4$ that is selective to the substrate 12. For an anisotropic etch, in which the etch rate is different in different directions, an etchant solution containing a mixture of KOH and $H_2O$ can be utilized. As shown in FIG. 5A, this results in the formation of triangular shaped sharpened projections 40, 42, 44, 46. This triangular shape is a function of the different etch rates of monocrystalline silicon along the different crystalline orientations. The surface of the substrate 12 represents the (100) planes of the silicon which etches faster than the sloped sidewalls that represent the (110) plane. For a silicon substrate 12, the slope of the sidewalls of the sharpened projections is about 54° with the horizontal. For forming the triangular shaped sharpened projections 40, 42, 44, 46 the width of the masking blocks 18, 20, 24, 26 and the parameters of the etch process are controlled to form a pointed tip 58 on each projection 40, 42, 44, 46.

Figure 5B:
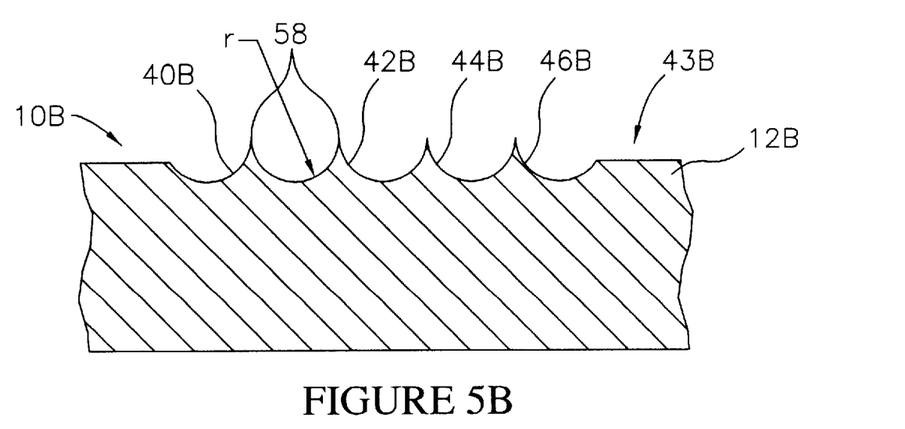
FIG. 5B is a cross sectional view, equivalent to FIG. 5A, showing the sharpened projections formed on the substrate with a rounded profile using an isotropic etch process.

For an isotropic etch, in which the etch rate is the same in all directions, an etchant solution containing a mixture of HF, $HNO_3$ and $H_2O$ can be utilized. As shown in FIG. 5B, this results in sharpened projections 40B, 42B, 44B, 46B having a pointed tip 58B and a rounded sidewall contour. In this embodiment the sidewalls of the sharpened projections 40B, 42B, 44B, 46B are undercut below the masking blocks 18, 20, 24, 26 (FIG. 4) with a radius "r". The value of the radius "r" is controlled by the etch parameters (i.e., time, temperature, concentration of etchant) and by the width of the masking blocks 18, 20, 24, 26 (FIG. 4).

Figure 5C:
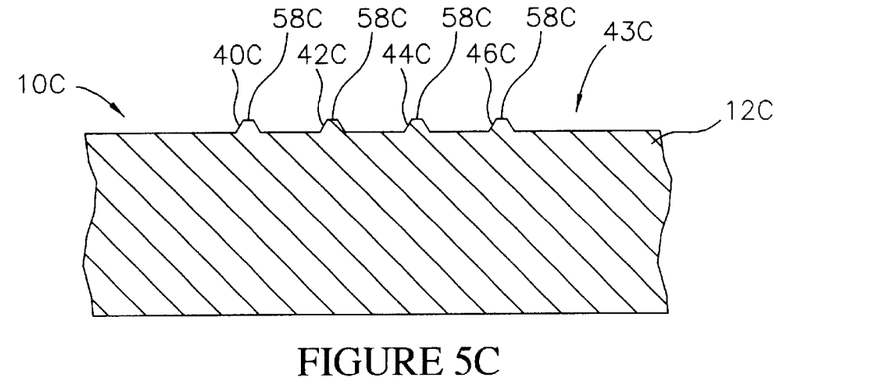
FIG. 5C is a cross sectional view equivalent to FIG. 5A showing the sharpened projections formed on the substrate with a truncated pyramidal cross section, using an anisotropic etch process.

FIG. 5C illustrates another embodiment wherein the sharpened projections 40C, 42C, 44C, 46C are formed with a cross section of a truncated pyramid with a flat tip 58C. In this embodiment an anisotropic etch is used. In addition, the width of the masking blocks 18, 20, 24, 26 and parameters of the etch process (e.g., time, temperature, concentration of etchant) are controlled to form the flat tip 58C.

Figure 5D:
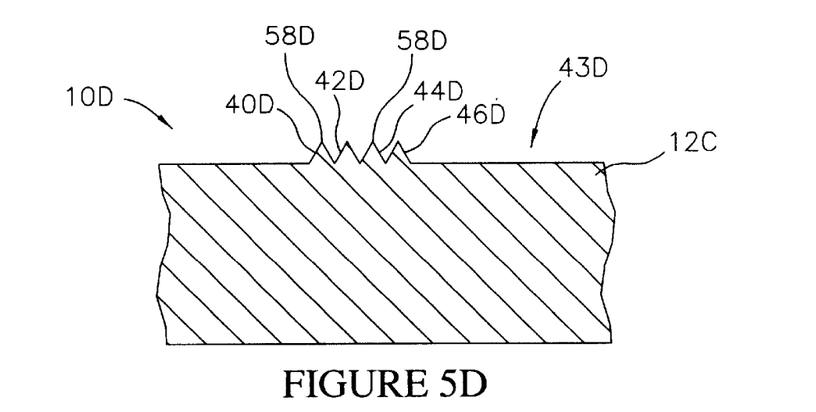
FIG. 5D is a cross sectional view equivalent to FIG. 5A showing the sharpened projections formed on the substrate using an anisotropic etch with no spaces in between the projections.

FIG. 5D illustrates another embodiment wherein the sharpened projections 40D, 42D, 44D, 46D are formed in a saw tooth array with no spaces between the base portions. In this embodiment an anisotropic etch is used and the process parameters, including the etch time and width of the masking blocks 18, 20, 24, 26 are controlled to provide a desired height and tip 58D to tip 58D spacing.

Figure 5E:
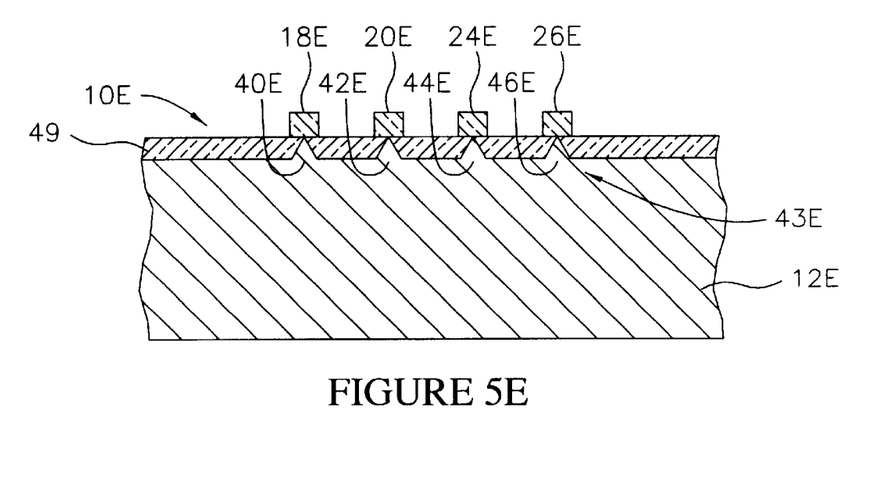
FIG. 5E is a cross sectional view showing the sharpened projections formed on the substrate using an oxidation growth process.

Alternately, in place of an isotropic or anisotropic etch process, the sharpened projections can be formed using an oxidizing process. This is shown in FIG. 5E. With an oxidizing process the substrate 12E may be subjected to an oxidizing atmosphere to oxidize exposed portions of the substrate 12 not covered by the masking blocks 18E, 20E, 24E, 26E. As an example, the oxidizing atmosphere may comprise steam and $O_2$ at an elevated temperature (e.g., 950° C.). The oxidizing atmosphere oxidizes the exposed portions of the substrate 12 and forms an oxide layer 49 (e.g., silicon dioxide). At the same time, sharpened projections 40E, 42E, 44E and 46E are formed under the masking blocks 18E, 20E, 24E, 26E. With an oxidizing process, the oxide layer 49 can also be stripped using a suitable wet etchant such as HF.

The sharpened projections can also be formed by a deposition process out of a different material than the substrate 12. As an example, a CVD process can be used to form the sharpened projections out of a deposited metal.

Figure 6:
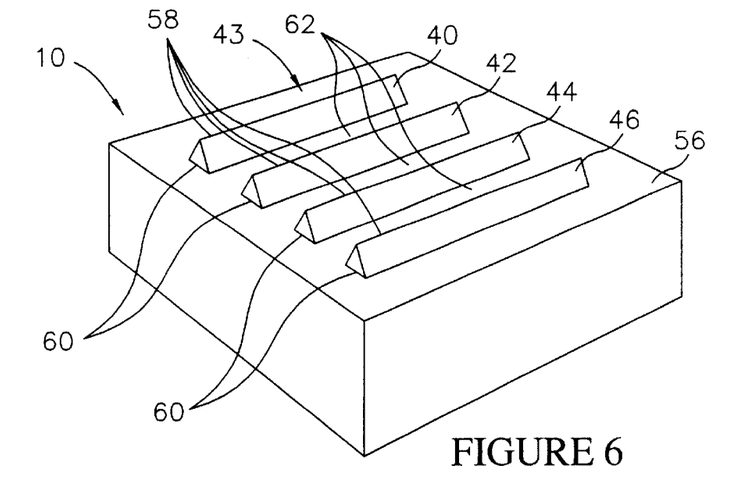
FIG. 6 is a perspective view of the substrate and sharpened projections shown in FIG. 5.

Referring now to FIG. 6, which represents the structure after completion of the process illustrated by FIG. 5A, the sharpened projections 40, 42, 44, 46 are formed in an array of parallel spaced, elongated, knife edges which form a contact member 43. The contact member 43 has an overall peripheral dimension adapted to accommodate the size of a raised contact location (e.g., bumped bond pad) on a semiconductor die. Although multiple sharpened projections are formed for each contact member 43, it is to be understood that a single sharpened projection per contact member 43 would also be suitable.

The sharpened projections 40, 42, 44, 46 project from a surface 56 of the substrate 12 and include pointed tips 58 and bases 60. The bases 60 of adjacent sharpened projections 40, 42, 44, 46 are spaced from one another a distance sufficient to define a penetration stop plane 62 there between. The function of the penetration stop plane 62 will be apparent from the continuing discussion. Example spacing between bases 60 would be 10 μm, while an example length of the bases 60 and tips 58 would be from 3 to 10 μm. The height of each sharpened projections 40, 42, 44, 46 is preferably about one-thousandth (1/1000) to one-quarter (¼) the diameter of a bumped bond pad on a semiconductor die. This height is selected to allow good electrical contact and at the same time provide minimum damage to raised contact locations (e.g., bumps) on dice that are typically tested using the interconnect 10 and then used for flip chip bonding. As an example, this projecting distance of the sharpened projections 40, 42, 44, 46, from the substrate 12 will be on the order of 1 to 3 μm. Subsequent to formation of the sharpened projections 40, 42, 44, 46, additional etching may be used to further sharpen the tips 58.

Figure 7:
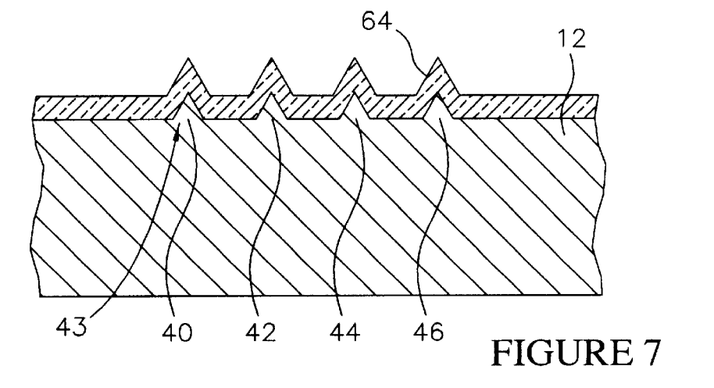
FIG. 7 is a cross sectional view of the substrate and sharpened projections showing the formation of an insulating layer over the substrate.

Following the formation of the sharpened projections 40, 42, 44, 46 and as shown in FIG. 7, an insulating layer 64 is formed over the entire substrate 12 including the contact member 43. The insulating layer 64 can be formed of a material such as $SiO_2$ by exposing the substrate 12 to an oxidizing atmosphere for a short time or by using a CVD process. The insulating layer 64 can also be formed of a material such as $Si_3N_4$.

Figure 8:
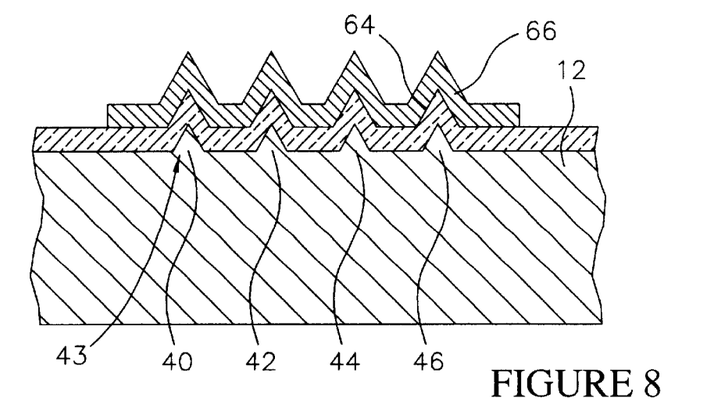
FIG. 8 is a cross sectional view of the substrate and sharpened projections showing the formation of a conductive layer on the sharpened projections.

Next, as shown in FIG. 8, a conductive layer 66 is formed on the insulating layer 64 and in an area of the substrate overlying each contact member 43. The conductive layer 66 can be formed of a highly conductive metal, such as aluminum (Al), iridium (Ir), copper (Cu), titanium (Ti), tungsten (W), tantalum (Ta), molybdenum (Mo) or alloys of these metals. A suitable metallization process to form the conductive layer 66 can include the steps of deposition (e.g., sputter, CVD), patterning (e.g., photopatterning) and etching (e.g., wet or dry etch).

The conductive layer 66 can also be formed of a conductive material such as doped polysilicon. As an example, an LPCVD process can be used to form a conductive layer 66 out of polysilicon doped with phosphorus.

Figure 8A:
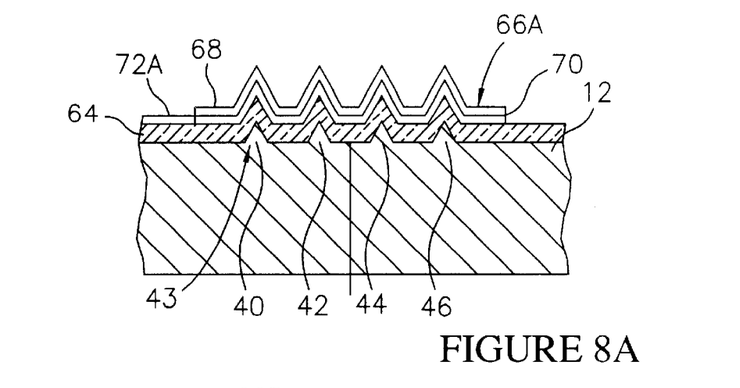
FIG. 8A is a cross sectional view of the substrate and sharpened projections showing the formation of a conductive layer on the sharpened projections comprising a stack of two different metal layers.

As shown in FIG. 8A, a conductive layer 66A can also be formed as a stack of two materials. The stacked conductive layer 66A includes a barrier layer 68 and a bonding layer 70. The barrier layer 68 is formulated to prevent formation of an oxide layer that would change the resistivity of the contact member 43. In addition, the barrier layer 68 is formulated to prevent reaction of the conductive layer 66A with the contact location (e.g., metal bump 88—FIG. 10) on the die and prevent the diffusion of impurities from the contact location on the die to the bonding layer 70 and vice versa.

The barrier layer 68 is preferably a metal that will not easily form a "permanent" or "chemical" bond with a raised metal contact location on the die even under a large mechanical force (e.g., 10 lb./interconnect) and at high temperatures. In addition, this metal must be chemically stable (i.e., non reactive) for temperatures up to about 200° C. By way of example, the barrier layer 68 can be formed of a metal such as platinum (Pt), titanium (Ti) or a titanium alloy (e.g., TiN, TiW).

The bonding layer 70 is formulated to provide a good mechanical bond with conductive traces 72A that are subsequently formed on the substrate 12 out of a highly conductive material. By way of example, the bonding layer 70 can be formed of aluminum (Al), tungsten (W) or titanium (Ti). In some applications the bonding layer 70 can be formed of a same material as the conductive traces 72A using a single masking step.

Figure 8B:
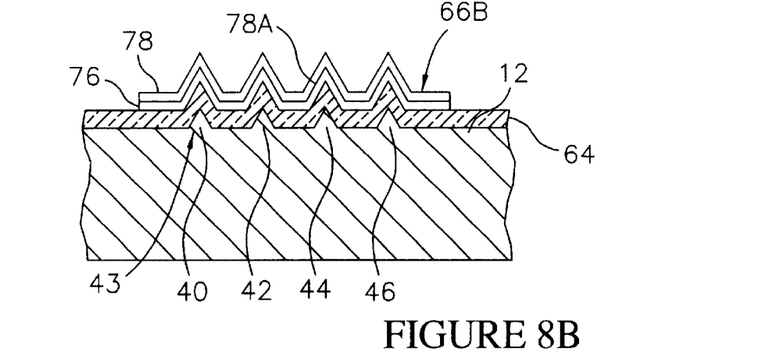
FIG. 8B is a cross sectional view of the substrate and sharpened projections showing the formation of a conductive layer on the projections formed of a metal silicide.

As shown in FIG. 8B, a conductive layer 66B can also be formed by depositing a silicon containing layer 76 (e.g., polysilicon, amorphous silicon) and a metal layer 78, and reacting these layers to form a metal silicide 78A. A typical thickness of the silicon containing layer 76 would be from about 500 Å to 3000 Å.

The metal layer 78 is formed of a metal that will react with the silicon containing layer 76 to form a metal silicide. Suitable metals include the refractory metals, such as titanium (Ti), tungsten (W), tantalum (Ta), platinum (Pt) and molybdenum (Mo). In general, silicides of these metals ($WSi_2$, $TaSi_2$, $MoSi_2$, $PtSi_2$ and $TiSi_2$) are formed by alloying with a silicon surface. Other suitable metals include cobalt (Co), nickel (Ni), molybdenum (Mo), copper (Cu), gold (Au) and iridium (Ir).

Following deposition of the metal layer 78, a sintering process is performed in which the metal layer 78 is heated and reacts with the silicon containing layer 76 to form a silicide layer 78A. This type of sintering process is also known in the art as silicide sintering. Such a sintering step can be performed by heating the silicon containing layer 76 and metal layer 78 to a temperature of about 650° to 820° C. for typical thicknesses in thousands of angstroms (e.g., 2000 Å—3000 Å). This sintering process can be performed in one single step or using multiple temperature steps. A silicide layer 78A forms at the interface of the metal layer 78 and the silicon containing layer 76.

The unreacted portions of the metal layer 78 and the silicon containing layer 76 are removed while the silicide layer 78A is left intact. This process is known in the art as a salicide process. This can be done by etching the metal layer 78 and silicon containing layer 76 selective to the silicide layer 78A. By way of example, for a $TiSi_2$ silicide layer 78A, the unreacted titanium can be removed with a wet etchant such as a solution of ammonia and hydrogen peroxide, or a $H_2SO_4/H_2O_2$ mixture, that will attack the metal layer 78 and not the silicide layer 78A. Alternately, a dry etch process with an etchant species such as $Cl_2$ or $BCl_3$ can be used to etch the metal layer 78 selective to the silicide layer 78A.

For etching the unreacted portion of the silicon containing layer 76 selective to the silicide layer 78A, a wet etchant such as an $HF:HNO_3:H_2O$ acid mixture (typical ratios of 1:10:10) can be used to remove the unreacted silicon. A wet isotropic etchant can also be used for this purpose. Alternately the silicon containing layer 76 can be etched selective to the silicide layer 78A using a dry etch process and an etchant such as $NF_3$ at low pressures (typically 30 m torr) or $CL_2$ and HBr at 130 m torr.

Following formation of the silicide layer 78A, the resistivity of the silicide layer 78A may be lowered using an annealing process. This may be accomplished by heating the substrate 10 and silicide layer 78A to a temperature of between about 780° C. to 850° C. for several minutes.

Figure 9:
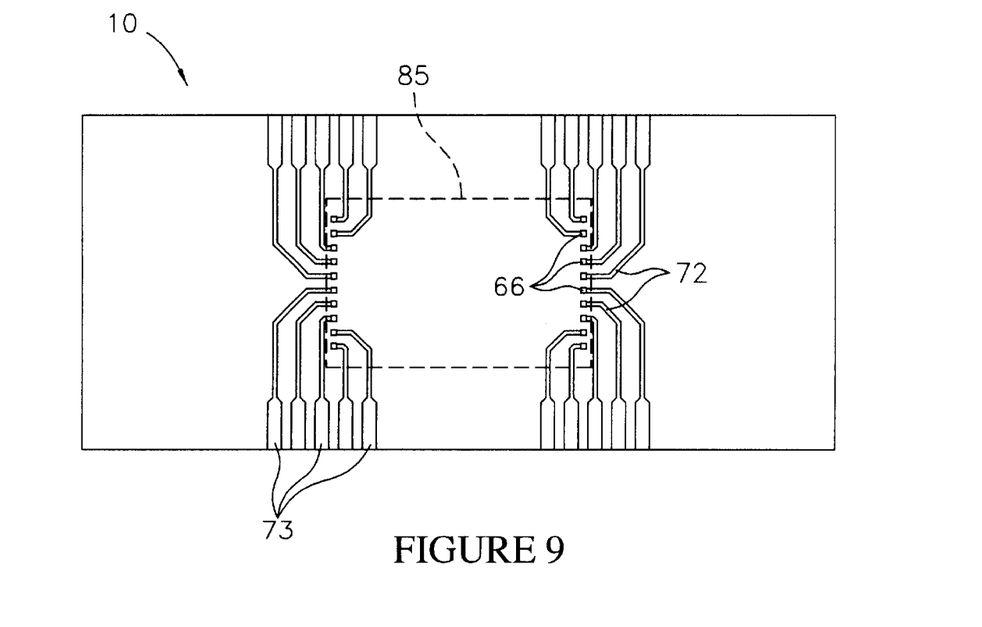
FIG. 9 is a plan view of an interconnect formed in accordance with the invention.

FIG. 9 is a plan view of the completed interconnect 10 with a semiconductor die 85 superimposed. As shown in FIG. 9, conductive traces 72 are formed on the interconnect 10 in electrical communication with the conductive layer 66 (or 66A—FIG. 8A, 66B—FIG. 8B). As also shown in FIG. 9, the conductive traces 72 extend to an edge of the interconnect 10 and include bond sites 73. The bond sites 73 are used for wire bonding a bond wire 74 (FIG. 10) to provide an electrical pathway from external test circuitry to the conductive layer 66. This electrical pathway can also be established using a mechanical connectors 74M (e.g., slide contacts, clip contacts) adapted to provide a temporary electrical connection with the conductive traces 72.

Figure 10:
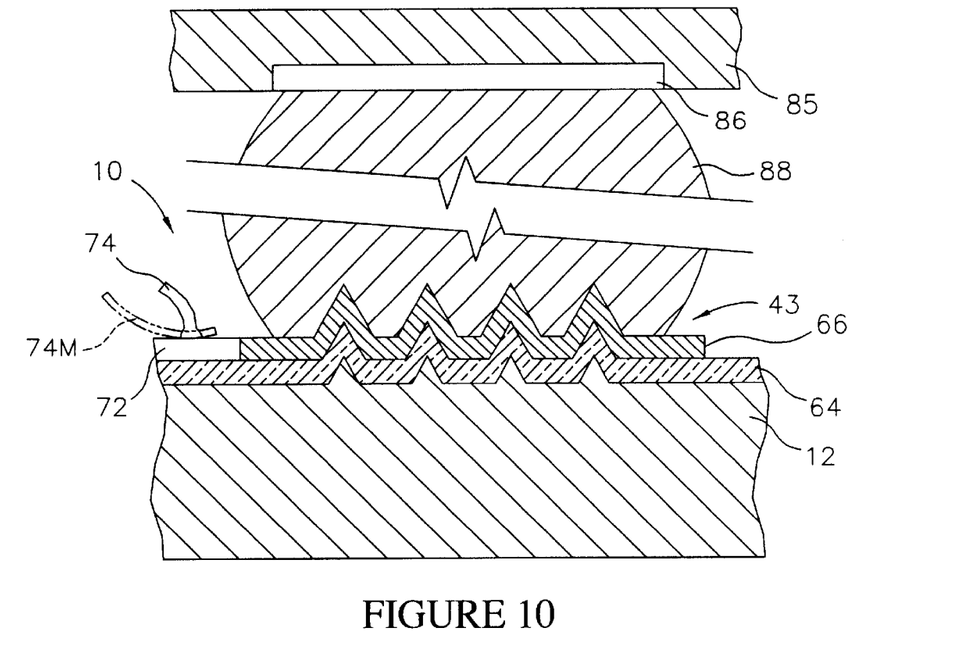
FIG. 10 is a cross sectional view illustrating testing of an unpackaged semiconductor die using an interconnect formed in accordance with the invention and showing the sharpened projections electrically engaging a bumped contact location of the die.

Referring now to FIG. 10, a cross section of the interconnect 10 during testing of a semiconductor die 85 is shown. The semiconductor die 85 is an unpackaged die having a bond pad 86 formed with a metal bump 88. For testing the die 85, the interconnect 10 and die 85 are mounted within a temporary carrier suitable for testing discrete unpackaged semiconductor die. By way of example, a temporary carrier is described in previously cited U.S. Pat. No. 5,302,891 entitled "Discrete Die Burn-In For Non-Packaged Die", which is incorporated herein by reference. Other suitable carriers are disclosed in related U.S. Pat. No. 5,541,521 filed Nov. 14, 1994 and entitled "Carrier For Testing An Unpackaged Semiconductor Die", which is also incorporated herein by reference. With such a carrier the interconnect 10 is used to establish a temporary electrical connection with the die 85. The interconnect 10 and die 85 are temporarily biased together by the carrier and are separated following the test procedure.

Initially, the interconnect 10 is mounted within the carrier and wire 74 is wire bonded to the bond sites 73 (FIG. 9). (Alternately mechanical connectors 74M—FIG. 10 can be used.) This places the wire 74 in electrical communication with the conductive layer 66 at one end. An opposite end of the wire 74 is placed in electrical communication with external connectors (not shown) located on the carrier. This can also be accomplished by wire bonding.

The external connectors on the carrier are connectable to external test circuitry. The test circuitry is adapted to generate test signals for testing the operability of the integrated circuits formed on the die 85. The carrier includes provision for aligning the die 85 and interconnect 10 and biasing the die 85 and interconnect 10 together.

The interconnect 10 and die 85 are biased together such that the sharpened projections 40, 42, 44, 46 penetrate into the metal bump 88. The sharpened projections 40, 42, 44, 46 completely penetrate any oxide layer covering the bump 88 to establish an ohmic connection. At the same time, a penetration depth of the sharpened projections 40, 42, 44, 46 into the bump 88 is limited by the stop plane 62 (FIG. 6) provided by the flat top surface of the conductive layer 66.

Additionally, the sharpened projections 40, 42, 44, 46 are dimensioned to penetrate to a predetermined depth that is less than the height of the bump 88. Preferably the sharpened projections have a height which is much less than the diameter of the bump 88 (e.g., 1/100) to prevent excessive surface damage and spreading of the bump 88. The bumps 88 are typically used later for flip chip bonding the die 85 to a printed circuit board. If damage to the bump 88 is minimized during testing, the bump 88 will not require a subsequent reflow process.

Figure 10A:
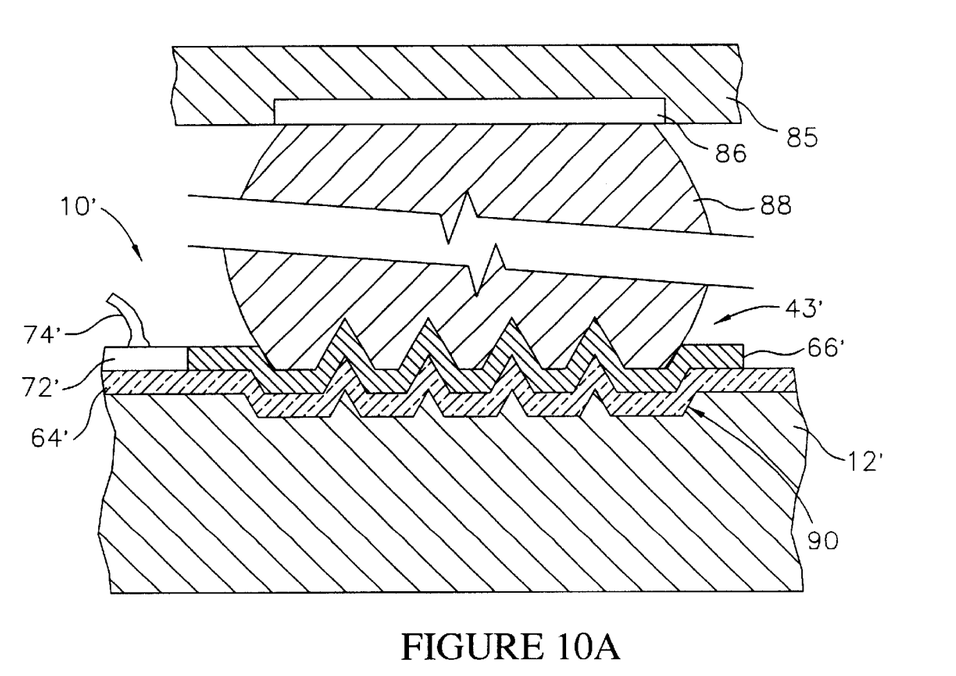
FIG. 10A is a cross sectional view illustrating testing of an unpackaged semiconductor die in accordance with the invention using an alternate embodiment contact structure in which the sharpened projections are mounted within an indentation formed in the substrate.

Referring now to FIG. 10A, an alternate embodiment interconnect 10' is shown. The interconnect 10' functions substantially the same as interconnect 10 but includes an indentation 90 formed in the substrate 12' for retaining the bump 88. The indentation 90 can be formed during formation of the sharpened projections for the contact member 43' using an etching process. The same etch mask used to form the sharpened projections can also include an opening for forming the indentation 90. The indentation 90 is sized to abut and retain the bump 88 during the testing procedure. This centers the bump 88 over the contact member 43'. In addition the indentation 90 helps to prevent spreading of the bump 88 due to the penetration of the sharpened projections of the contact member 43'.

Following formation of the indentation 90 and contact member 43' an insulating layer 64' is formed on the substrate 12' and a conductive layer 66' is formed over the contact member 43' substantially as previously described. The conductive layer 66' can be formed to overlap the indentation 90 as shown in FIG. 10A. In addition the conductive layer 66' can be formed as a stack of dissimilar metals (e.g., FIG. 8A), as a silicide (e.g., FIG. 8B) or as a layer of polysilicon. Conductive traces 72' equivalent to traces 72 (FIG. 9) are formed on the substrate 12' in electrical communication with the conductive layer 66'. Wire bonding or mechanical connectors, as previously described, can then be used to establish an electrical pathway to the conductive layer 66'.

Thus the invention provides an improved method for testing a discrete, unpackaged semiconductor die having raised bond pads and an improved method for forming an interconnect for testing this type of die. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. An interconnect for testing a semiconductor die having a bump comprising:
   a substrate; and
   a contact on the substrate configured to make a temporary electrical connection with the bump under a biasing force, the contact comprising an indentation in the substrate having a surface, a plurality of projections on the surface comprising portions of the substrate configured to penetrate the bump at the biasing force while the surface limits further penetration into the bump, and a conductive layer at least partially covering the projections and the indentation, the conductive layer comprising a metal that does not bond to the bump at the biasing force,
   the indentation sized such that the conductive layer abuts the bump, centering the bump on the projections, and preventing the bump from spreading with penetration by the projections.

2. The interconnect of claim 1 wherein the projections comprise etched portions of the substrate.

3. The interconnect of claim 1 wherein the conductive layer comprises a bonding layer between the substrate and the metal.

4. In a test carrier configured to retain a semiconductor die having a bump for testing, an interconnect configured to electrically engage the die in the test carrier under a biasing force applied by the test carrier, the interconnect comprising:
   a substrate configured for placement on the test carrier; and
   a contact on the substrate configured to make a temporary electrical connection with the bump, the contact comprising an indentation in the substrate having a surface, a plurality of spaced projections on the surface comprising etched portions of the substrate, and a conductive layer at least partially covering the projections and the indentation, the projections configured to penetrate into the bump under the biasing force while the surface limits further penetration, the indentation configured to center the bump on the projections, and to prevent the bump from spreading during penetration by the projections.

5. The interconnect of claim 4 wherein the conductive layer comprises a metal that does not bond to the bump at the biasing force.

6. The interconnect of claim 4 wherein the conductive layer comprises a metal selected from the group consisting of platinum, titanium, alloys of platinum and alloys of titanium.

7. An interconnect for testing a semiconductor die having a bump comprising:
   a substrate;
   a contact on the substrate configured to make a temporary electrical connection with the bump, the contact comprising:
   a plurality of elongated projections on the substrate configured to penetrate the bump under a biasing force applied to the die or to the interconnect, each projection having a height of from 1/1000 to 1/4 of a diameter of the bump;
   an indentation in the substrate; and
   a conductive layer at least partially covering the indentation and the projections comprising a metal selected to not bond to the bump at the biasing force, the indentation sized such that the conductive layer abuts the bump, centering the bump on the projections, and preventing the bump from spreading with penetration by the projections.

8. The interconnect of claim 7 wherein the conductive layer comprises a first layer configured for bonding to the substrate and a second layer comprising the metal.

9. The interconnect of claim 7 wherein the projections have truncated pyramidal cross sections.

10. The interconnect of claim 7 wherein the metal comprises platinum or titanium.

11. In a test carrier configured to retain a semiconductor die having a bump for testing, an interconnect configured to electrically engage the die under a biasing force applied by the test carrier, the interconnect comprising:

a substrate configured for placement on the test carrier;

a plurality of contacts on the substrate configured to make temporary electrical connections with the bumps, each contact comprising:

an indentation in the substrate configured to retain the bump and having a surface;

a plurality of projections on the surface configured to penetrate the bump at the biasing force while the surface limits further penetration, the projections having a height of from $1/1000$ to $1/4$ of a diameter of the bump;

a conductive layer at least partially covering the indentation and the projections comprising a metal selected to not bond to the bump at the biasing force, the indentation sized such that the conductive layer abuts the bump, centering the bump on the projections, and preventing the bump from spreading with penetration by the projections.

12. The interconnect of claim 11 wherein the metal comprises platinum or titanium.

* * * * *